United States Patent [19]
Acuff

[11] Patent Number: 5,894,227
[45] Date of Patent: Apr. 13, 1999

[54] LEVEL RESTORATION CIRCUIT FOR PASS LOGIC DEVICES

[75] Inventor: Mark W. Acuff, Hillsboro, Oreg.

[73] Assignee: Translogic Technology, Inc., Beaverton, Oreg.

[21] Appl. No.: 08/616,682

[22] Filed: Mar. 15, 1996

[51] Int. Cl.[6] .................. H03K 17/16; H03K 19/0175
[52] U.S. Cl. ............................ 326/68; 326/27; 326/113
[58] Field of Search ............................. 326/21, 26, 27, 326/68, 71, 113

[56] References Cited

U.S. PATENT DOCUMENTS

| | | | |
|---|---|---|---|
| 3,728,556 | 4/1973 | Arnell | 326/27 |
| 3,801,831 | 4/1974 | Dame | 326/81 |
| 4,486,670 | 12/1984 | Chan et al. | 326/68 |
| 4,912,348 | 3/1990 | Maki et al. | 326/113 |
| 4,920,284 | 4/1990 | Denda | 326/68 |
| 5,136,190 | 8/1992 | Chern et al. | 326/71 |
| 5,162,666 | 11/1992 | Tran | 327/408 |
| 5,410,508 | 4/1995 | McLaury | 365/230.06 |
| 5,473,268 | 12/1995 | Declercq et al. | 326/68 |
| 5,548,231 | 8/1996 | Tran | 326/21 |
| 5,677,641 | 10/1997 | Nishio et al. | 326/121 |

OTHER PUBLICATIONS

"Mixed–Voltage Design Challenges", by John Harrington, ASIC & EDA, Nov. 1993, pp. 36–40.

"Principles of CMOS VLSI Design: A Systems Perspective, Chapter 5: CMOS Circuit and Logic Design", by Neil H.E. Weste and Kamran Eshraghian, Addison–Wesley Publishing Company, Oct. 1985, pp. 159–175.

Primary Examiner—Michael J. Tokar
Assistant Examiner—Richard Roseen
Attorney, Agent, or Firm—Klarquist Sparkman Campbell Leigh & Whinston LLP

[57] ABSTRACT

A level restore circuit used in MOS logic circuit design provides a voltage swing from a valid low to a valid high logic level in response to an input signal ranging from a degraded voltage high signal to a logic low signal. An input stage receives the degraded logic signal and provides separate gate drive signals to an inverter. An inverter in the intermediate stage receives the separate drive signals and provides an inverted signal output at a valid logic level. The intermediate stage also includes a pull-up device to pull up one of the gate nodes of the inverter to a logic high level. An output stage can optionally be coupled to the inverter to isolate it from a load.

22 Claims, 4 Drawing Sheets

FIG. 8

LEVEL RESTORATION CIRCUIT FOR PASS LOGIC DEVICES

FIELD OF THE INVENTION

The invention generally relates to logic circuit design, and more specifically relates to a circuit for restoring valid logic levels in a pass-gate circuit.

BACKGROUND OF THE INVENTION

In logic circuit design, it is sometimes necessary to insert level restoration circuitry into a circuit to restore a signal to a valid logic level. For example, a very long routing path in an integrated circuit can degrade a high logic signal due to the impedance of the routing trace. Heavily loaded lines can also degrade a valid logic high signal. This problem also occurs in pass-gate logic designs that include a number of transistors coupled in series because of the threshold voltage drop across the transistors.

Figure 1:
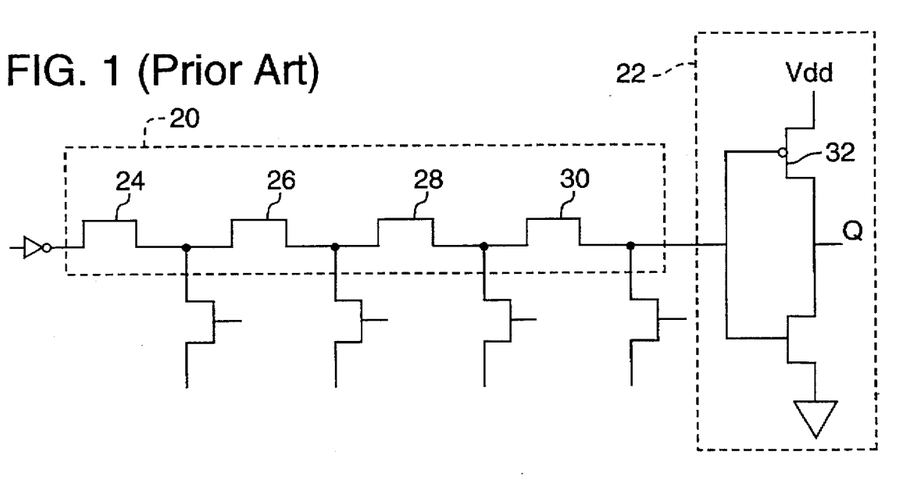
FIG. 1 is a schematic diagram illustrating an example of a pass-gate network coupled to an inverter.

Serial pass-gate logic refers to logic circuits where logical functions are implemented using a network of pass-gates coupled in series. FIG. 1 is a schematic diagram illustrating an example of a pass-gate string 20 coupled to an inverter 22. The term, "pass-gate" refers to the manner in which a gate in the logic network passes a logic signal from an input to an output when the gate is turned on. For example, FIG. 1 illustrates a string of four pass-gates 24–30 coupled in series. In order for the logic signal to pass from the input of the first pass-gate 24 to the output of the fourth pass-gate 30, each of the four pass-gates must be turned on.

Logic functions may be constructed from a network of pass-gates to produce a desired output in response to one or more inputs. When pass-gates are constructed of N-channel transistors coupled in series, it is sometimes difficult to produce valid logic signals at the output of the pass-gate network. Consider, for example, the pass-gate network illustrated in FIG. 1. This particular pass-gate network is able to produce a valid logic zero level, but it cannot produce a valid logic one level. The signal level is degraded because of the threshold voltage drop across each of the four pass-gates 24–30 coupled in series. Assuming a threshold voltage drop of one volt across the pass-gate string 20 and a supply voltage of 3 volts, the output of the N-channel pass-gate string will swing from about zero volts to about 2 volts. This output voltage swing is insufficient to reliably drive other logic stages coupled to the output of the pass-gate network.

Specifically in this case, the voltage swing produced by the pass-gate string is insufficient to reliably drive the inverter 22 coupled to the output of the pass-gate network. As a result, the P-channel transistor 32 in the inverter does not completely turn off when the logic signal at 2 volts is applied to the input. The failure of the P-channel transistor 32 to turn off can cause excessive static current to flow through the inverter and attenuate its output swing.

One possible solution is to increase the supply voltage. However, this alternative is unsatisfactory because the trend in the industry is toward lower power devices that operate at lower supply voltages. Increasing the supply voltage is contrary to this trend and results in higher power consumption.

Figure 2:
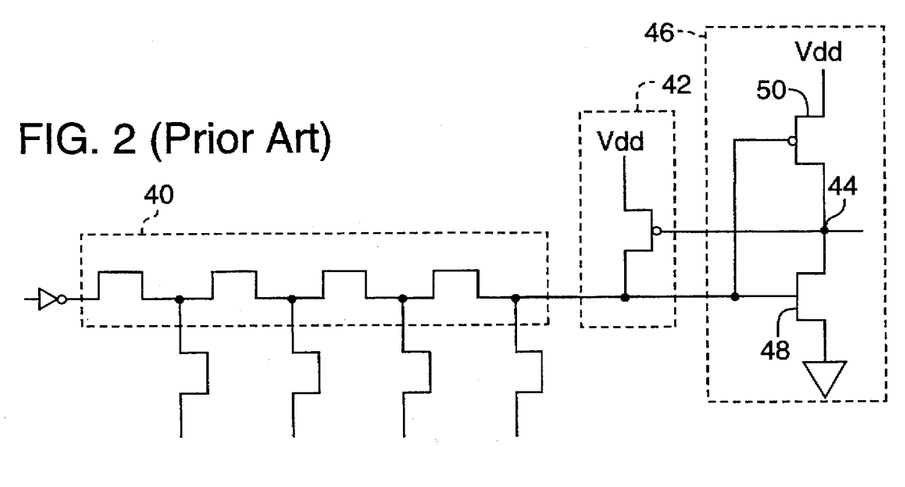
FIG. 2 is a schematic diagram illustrating a pass-gate network coupled to an inverter, and further including a pull-up transistor to address the problem of insufficient voltage swing at the output of the pass-gate network.

Another possible solution is to use a pull-up transistor connected as shown in FIG. 2. FIG. 2 is a schematic diagram of an N-channel pass-gate network 40 with a P-channel pull-up transistor 42. In this example, the P-channel pull-up transistor 42 is added to address the insufficient gate drive problem. The P-channel pull-up transistor 42 is driven by the output 44 of the inverter 46 and is designed to pull-up the output of the pass-gate network 40 to a valid logic signal. The P-channel transistor 42 coupled to the output of the inverter 46 forms a feedback path that detects the N-channel transistor 48 in the inverter turning on, and in response ensures that the P-channel transistor 50 in the inverter turns off.

When used in conjunction with an N-channel pass-gate network as shown in FIG. 2, the pull-up transistor 42 addresses the gate drive problem sufficiently at low frequencies. However, as the frequency increases, the P-channel pull-up transistor 42 cannot turn on fast enough to pull-up the output of the pass-gate network 40 to a valid logic signal. As a result, the signal swing at the input of the inverter 46 decreases, and eventually reaches an insufficient voltage swing from zero to 2 volts.

When a small pull-up transistor is used is relative to the N-channel devices in the pass-gate string, the source impedance of the pull-up transistor 42 is higher. As such, the pull-up transistor 42 cannot provide sufficient current to pull-up the transistors in the pass-gate string 40. The larger N-channel devices have a higher parasitic capacitance relative to the pull-up transistor, and thus, are more difficult to pull-up to a logic high level.

One solution to this problem is to increase the size of the pull-up transistor. This is an unsatisfactory solution, however, because it causes the logic level zero signal to the inverter to be degraded. The pass-gate string 40, due to its high resistance value, cannot source zero volts while the pull-up transistor 42 is active. The pass-gate string current must overcome the current sourced by the pull-up transistor 42 to achieve a logic zero value.

The problem with the pull-up transistor 42 in FIG. 2 is especially a concern when the speed of the N-channel and P-channel transistors is not matched. When the P-channel is faster than the N-channel devices in the string, it is more difficult for the N-channel devices to provide a valid logic low. In this case, the impedance of the pass-gate string is higher, making it more difficult for the string to sink current. When the N-channel devices are faster than the P-channel devices, it is more difficult for the P-channel device to source current and pull-up the output of the string to a logic high level.

As is apparent from the foregoing discussion, there is a need for an improved restoration circuit for insuring valid logic signals in pass-gate networks.

SUMMARY OF THE INVENTION

To address the drawbacks and limitations of the prior art, the invention provides an improved level restoration circuit.

The level restore circuit receives an input is logic signal that swings from a logic low level to a degraded logic high level, and produces an output signal that swings from a valid logic high to a valid logic low level. The level restore circuit includes an input stage, an intermediate stage, and optionally, an output stage. The input stage receives the input logic signal and provides separate gate drive signals to the gate nodes of an inverter. The intermediate stage includes an inverter with separate gate nodes for receiving the separate gate drive signals. The intermediate stage also includes a pull-up device for pulling up one of the gate nodes to a valid high logic level. The optional output stage is coupled to the inverter to isolate it from a load coupled to the output stage.

There are a number of possible variations to the level restore circuit. In one embodiment, the input stage comprises a P-channel transistor coupled between the pull-up device and ground. This P-channel transistor isolates the pull up device from other devices coupled at the input node of the input stage. For example, it can isolate the pull-up device from a pass-gate string. The P-channel transistor also separates the gate drive signals applied to the inverter. When a degraded logic signal is applied to the gate of the P-channel transistor, the pull-up device pulls up one of the gate drive signals of the inverter to a logic high level to ensure that the output of the inverter is a valid logic low signal.

To prevent leakage current through the input stage, an additional transistor can be coupled between the supply voltage and the input node of the input stage. This additional transistor serves as a pull-up device and prevents leakage current through the input stage at low frequencies. For example, if the input stage is a P-channel transistor receiving the degraded input signal at its gate node, then leakage current may flow through the P-channel transistor until it is turned off. This leakage current can be reduced with a small is P-channel device coupled between the supply voltage and the input node.

In an alternative embodiment, the input stage comprises an N-channel transistor coupled between the input node of the input stage and one of the gate nodes of the inverter. The N-channel transistor separates the gate nodes of the inverter and supplies a valid high logic signal when the input signal is at a degraded logic high level.

The optional output stage, in one embodiment, includes a P and an N-channel transistor coupled between the supply voltage and ground. The gates of the P and N-channel transistors are coupled to the gates of corresponding P and N-channel transistors in the inverter. The output stage reduces load dependent delay by isolating the inverter from the load coupled to the output stage.

Further advantages and features of the invention will become apparent with reference to the following detailed description and accompanying drawings.

DETAILED DESCRIPTION

Figure 3:
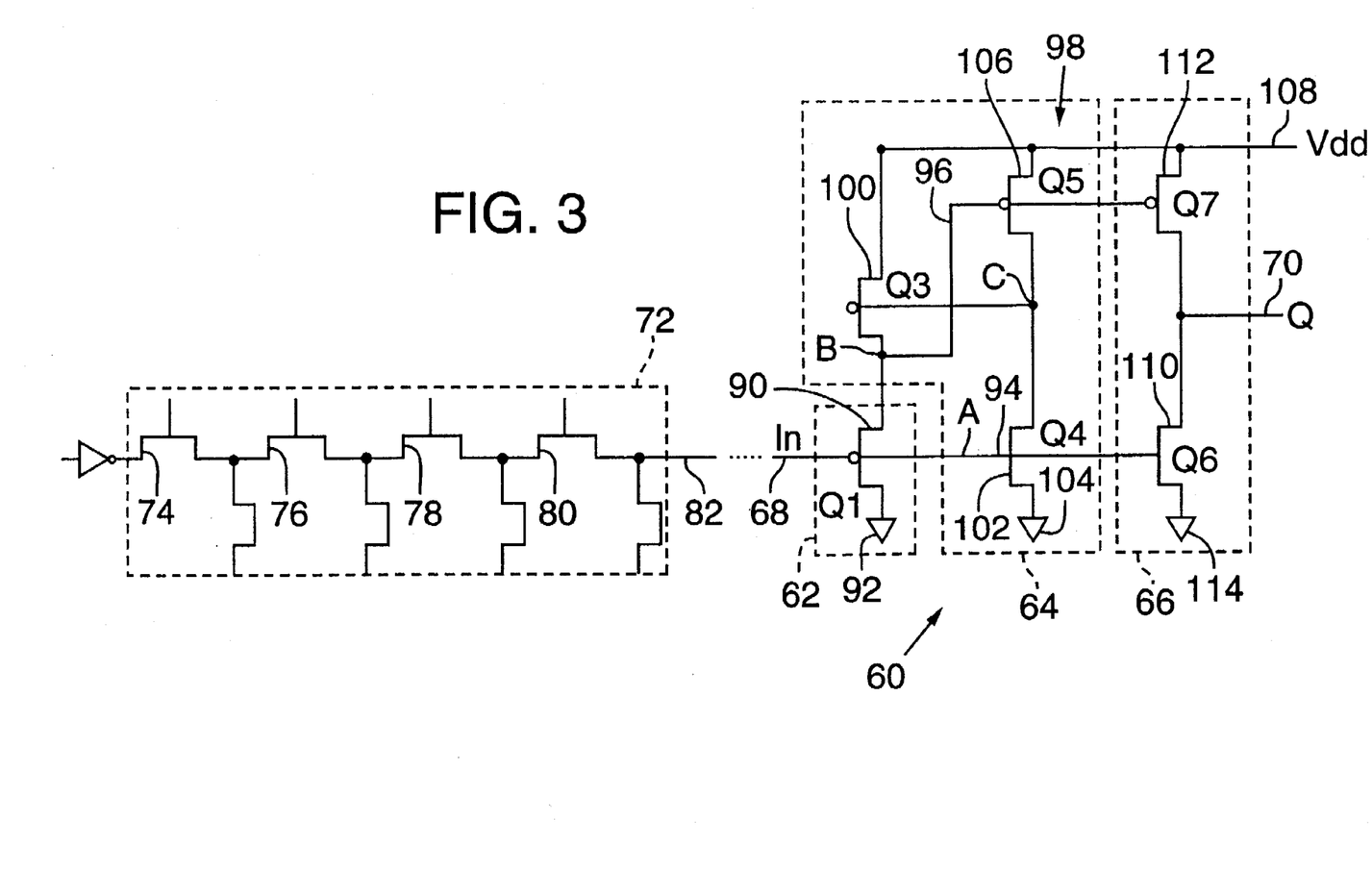
FIG. 3 is a schematic diagram of a level restore circuit in an embodiment of the invention.

FIG. 3 is a schematic diagram of an embodiment of a level restore circuit designed according to the invention. The level restore circuit 60 includes three stages: an input stage 62, an intermediate stage 64, and an output stage 66. The level restore circuit 60 is designed to restore a logic signal at the input node to a valid logic level. It receives an input logic signal at the input node (In) 68 of the input stage 62, adjusts the input signal so that it provides a sufficient gate drive, and provides a valid logic output signal at the output node (Q) 70 of the output stage 66.

One specific application of the level restore circuit is to restore a degraded signal provided at the output of a pass-gate network 72. FIG. 3 illustrates an example of a pass-gate network 72 coupled to the level restore circuit 60. Due to the threshold drop across the pass-gate string 74–80, the voltage at the output 82 of the string only swings from zero to (Vdd-V$_{threshold}$). The level restore circuit adjusts the input signal so that it provides sufficient gate drive to produce a voltage swing from a valid high level to a valid low level.

Throughout the specification, P and N-channel MOS (metal oxide semiconductor) devices are described in terms of their respective gate, drain and source nodes to help clarify the structure and operation of the alternative embodiments. According to standard convention, positive current flows from the drain to the source node in N-channel devices, and flows from the source to the drain in P-channel devices. The source and drain node conventions are used only to help describe the structure and operation of the invention and are not intended to limit the scope of the invention. It is possible to operate MOS transistors in reverse, especially if the source and drain regions are symmetrical. As such, the relative positions of the drain and source are not critical to the invention.

The input stage 62 in FIG. 3 includes a single P-channel transistor Q1 90 coupled between the intermediate stage 64 and ground 92. The input signal to the input stage 62 is applied to the gate of Q1 in this embodiment. The P-channel transistor 90 separates the gate drive nodes 94, 96 of an inverter 98 in the intermediate stage 64, and isolates a pull-up device 100 from the devices coupled to the input of the level restore circuit. For example, in the context of the pass-gate string in FIG. 3, the P-channel device 90 in the input stage isolates the pull-up transistor 100 in the intermediate stage 64 from the devices in the pass-gate string 74–80. Specifically, the gate of Q1 is coupled to the gate of an N-channel transistor 102 in the inverter, the drain is coupled to a ground node 104, and the source is coupled to the drain of the pull-up device 100 in the intermediate stage 64.

The intermediate stage 64 includes the inverter (Q4 and Q5) 98 with separated gate nodes 94–96, and a P-channel pull-up transistor Q3 100. The inverter 98 comprises an N-channel transistor Q4 102 and a P-channel transistor Q5 106 coupled between the supply voltage Vdd 108 and ground 104. As shown in FIG. 3, the drain of Q3 is coupled to the gate of Q5. The gate of Q3 is coupled to the drain of Q5 and Q4. And finally, the source nodes of Q3 and Q5 are coupled together and to the supply voltage Vdd.

For ease of illustration, the intermediate stage 64 has nodes labeled A, B and C. Node A is the gate of the N-channel transistor Q4 in the inverter. Node B is the node where the drain of Q3 is coupled to the gate of Q5. Node C is the output of the inverter 98 in the intermediate stage 64. It connects the gate of Q3 100 to the drain nodes of Q4 and Q5.

The output stage 66 comprises an N-channel transistor Q6 110 and a P-channel transistor Q7 112 coupled between the supply voltage Vdd 108 and ground 114. The gate of Q6 is coupled to the gate of Q4 in the intermediate stage (node B). The gate of Q7 is coupled to the gate of Q5 in the intermediate stage (node C). At the output node Q 70 of the output stage, the drain of Q6 is coupled to the drain of Q7.

The output stage 66 is not necessary to restore the gate drive signal, but it does make the delay of the level restore circuit less dependent on the load at the output Q. More detail regarding load dependent delay and how the output stage addresses this problem is provided below. In cases where the level restore circuit does not include the output stage, node C is the output node of the circuit.

The input stage 62 is coupled to the intermediate stage 64 such that separate gate drive signals are provided to the gate nodes 94 (node A), 96 (node B) of inverter 98 in the intermediate stage 64. Specifically, the P-channel transistor Q1 separates the gate nodes on the transistors Q4 and Q5 such that the gate drive for the P-channel transistor Q5 is offset by the threshold voltage of transistor Q1.

When the voltage at input node 68 of the input stage 62 transitions toward a high logic level, transistor Q1 turns off and node B is released. At about the same time, transistor Q4 turns on and node C transitions to a logic low level of about zero volts. As node C transitions to a logic low level, transistor Q3 turns on and pulls node B to about the logic high level of the supply voltage Vdd. In turn, P-channel transistor Q5 turns off. There is a brief period of contention between the time when Q4 turns on and Q5 turns off because Q3 has to turn on first and pull the gate drive signal of Q5 to a logic high value.

When the input node of the input stage transitions to a logic low level, the N-channel transistor Q4 turns off, releasing node C. The P-channel device Q1 turns on, pulling node B to about a threshold voltage drop above ground. As node B transitions to a logic low level, the P-channel transistor Q5 turns on. As a result, transistor Q5 pulls node C to about the logic high level of the supply voltage Vdd. When node C transitions to a logic high value, the P-channel transistor Q3 turns off, releasing node B. Again, there is a brief time of contention between Q1 and Q3 as Q5 turns on.

The input stage 62 in FIG. 3 isolates the pull-up transistor Q3 from the input node 68 (node A). This is advantageous in FIG. 3 because the output 82 of the pass-gate string is then isolated from the pull-up transistor Q3. Since the input node is isolated from the pull-up transistor Q3, devices connected to the input node 68 do not have to overcome the current sourced by the pull-up transistor 100 to achieve a logic low value at node B. Consider the example of the pass-gate string 72 of FIG. 3. In contrast to the circuit in FIG. 2, the pass-gate string 72 coupled to the input node 68 does not have to sink the current to achieve a logic low level when the pull-up transistor is active.

In addition, the pull-up transistor 100 does not have to source the current necessary to pull-up the devices 74–80 connected to the input node to a logic high level. The pull-up transistor Q3 100 is not connected directly to the devices coupled to the input node, and therefore does not have to source the current necessary to charge the parasitic capacitors of these devices. For example, the pull-up transistor Q3 would not have to source the current to pull-up the output of a pass-gate string to a logic high level.

The input stage and the pull-up transistor ensures that sufficient gate drive signals are applied to the inverter 98. Assume, for example, that the input stage 62 is driven by an N device pass-gate string, where N is an integer number representing the number of N-channel transistors coupled in the pass-gate string. In this case, the input node of the input stage will swing from about zero volts to about the supply voltage Vdd less the threshold voltage drop across the N pass-gate string (Vdd-$V_{threshold\ N\ devices}$). Node B will swing from:

$V_{threshold\ P}$ to

Vdd-$V_{threshold\ N\ devices}$+$V_{threshold\ P\ device}$ where:

$V_{threshold\ P}$ is the threshold voltage drop across P-channel transistor Q1;

Vdd is the supply voltage; and $V_{threshold\ N\ devices}$ is the threshold voltage drop across the N pass-gate string.

Figure 4:
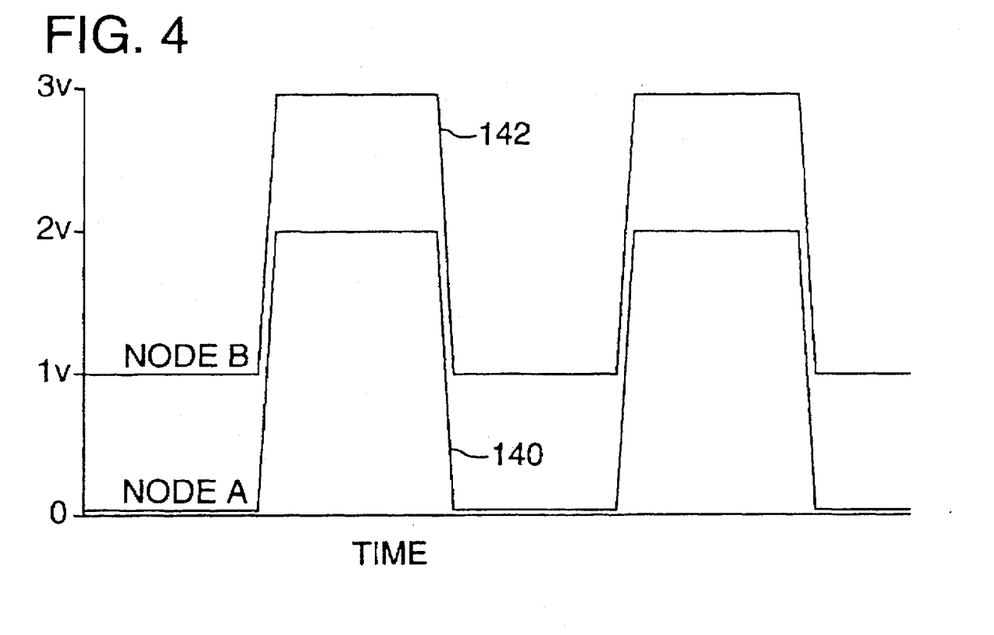
FIG. 4 is a diagram of waveforms illustrating the operation of the embodiment in FIG. 3.

The operation of the level restore circuit can be illustrated further by observing the waveforms of the signals at the gate nodes of Q4 and Q5. FIG. 4 is a diagram of two waveforms 140, 142 illustrating the gate drive signals applied to transistors Q4 and Q5. The waveforms illustrate the voltage signals at nodes A and B plotted over time. In this example, the voltage swing of the input logic signal ranges from zero to 2 volts. The supply voltage Vdd is 3 volts, and the threshold voltage drop across the P-channel device in the input stage is 1 volt. As the input node swings from zero to 2 volts, node B of the intermediate stage swings from 1 volt (the threshold voltage drop of the P-channel transistor Q1) to about the supply voltage. Node B swings nearly to the supply voltage because the voltage drop across the pull-up transistor Q3 is negligible.

If the supply voltage Vdd is increased, the input node and node B will both increase in amplitude, and thus leakage current through transistors Q1 and Q3 will not increase significantly. Also note that if threshold voltage across the pass-gate string and the threshold voltage of the P-channel transistor Q1 change together, they will cancel each other. If the threshold voltage drop across the N pass-gate string is much greater than the threshold voltage drop across the P-channel transistor Q1, there is a potential for static current through transistors Q1 and Q3. Static leakage current may result through Q1 and Q3 if the input node to the input stage presents a poor logic high value, such as 2 volts. A poor logic level presented at the input to Q1 would likely tend to cause Q1 to turn on slightly and result in a higher leakage current through transistors Q1 and Q3.

While the level restore circuit can operate without the output stage, such a circuit can be sensitive to loads placed at the output of the intermediate stage. This problem is sometimes referred to as "load dependent delay." Because of this effect, the delay experienced at the output node C of the intermediate stage increases with an increased load coupled to node C. In addition, the frequency bandwidth can be adversely affected as the load is increased. One way to solve this problem is to add an inverter at the output of the intermediate stage. While adding an inverter does tend to isolate the intermediate stage from the load, it also injects additional propagation delay.

A better solution to the load dependent delay problem is to add an output stage as shown in FIG. 3. The output stage 66 isolates the intermediate stage from the load so that heavy loads can be driven without adversely affecting the operation of the intermediate is stage.

Since the gate drive signals for the inverter in the intermediate stage and the output stage are the same, the transistors Q6 and Q7 in the output stage operate similarly to the transistors Q4 and Q5 in the intermediate stage. Specifically, when the input signal to the input stage is a logic low level, P-channel transistors Q5 and Q7 turn on and the output of the output stage Q is pulled up to about the logic high level of the supply voltage Vdd. Conversely, when the input signal to the input stage is a logic high level, transistors Q4 and Q6 turn on, and the output Q is pulled down to a logic low level.

Figure 5:
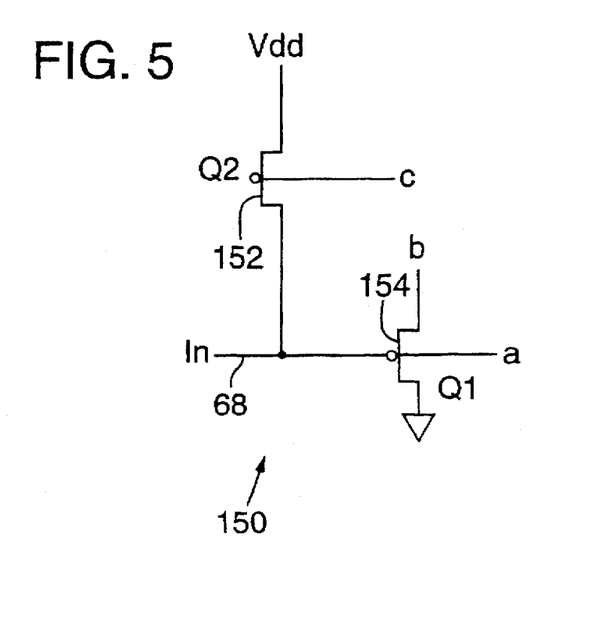
FIG. 5 is a diagram of an alternative embodiment of the input stage of the level restore circuit in FIG. 3.

There are a number of possible variations to the circuit configuration in the input stage 62. FIG. 5 is a schematic diagram of an alternative implementation of the input stage 62. The input stage 150 illustrated in FIG. 5 includes an additional P-channel transistor 152 coupled between the input node and the supply voltage Vdd. The second P-channel transistor Q2 is coupled to the intermediate stage and the first P-channel transistor Q1 154. The drain of Q2 is coupled to the input node 68 of the input stage 150 and to the gate node of the first P-channel transistor Q1 154. The gate is coupled to node C of the intermediate stage, and the source node is coupled to the supply voltage Vdd.

The input stage 150 illustrated in FIG. 5 is particularly well suited to address the static leakage current problem described in connection with FIG. 3. Recall that the static leakage current problem can occur when the input signal to the input stage does not present a valid logic high signal. The transistor Q2 in FIG. 5 solves the static leakage current by effectively turning off transistor Q1 to prevent leakage current through Q1 and Q3.

The input stage shown in FIG. 5 operates as follows. When the input signal to the input stage is degraded by a threshold voltage drop, it only reaches about 2 volts, assuming a supply voltage Vdd of 3 volts. This voltage is insufficient to turn off Q1 and causes leakage current to flow through Q1 and Q3. However, the input signal of 2 volts begins to turn transistor Q4 (FIG. 3) on, which, in turn, pulls node C down to a logic low level. When the gate of transistor Q1 154 is pulled to a logic low level, it turns on and pulls up the input node 68 (node A) to a logic high level. Thus, a small P-channel transistor Q2 can be used to turn off Q1 completely and eliminate excessive leakage current.

The small amount of current sourced by Q2 is sufficient at idle and low frequencies to minimize static leakage current. At higher frequencies, it is less effective in pulling the input node up to the supply voltage. However, the static leakage current is swamped by the high charging currents of Q1 through Q5 in the intermediate stage.

The input stage 150 of FIG. 5 and the intermediate stage of FIG. 3 can be used with or without the output stage to restore a valid logic signal. Without the output stage, the output of the level restore circuit is node C. The output at node C is at a valid logic high level when the input signal is a logic low level. Conversely, the output node C is a valid logic low signal when the input signal is at a valid logic low level. The combination of the intermediate stage in FIG. 3 and the input stage of FIG. 5, thus, provide a voltage swing at node C ranging from a valid logic low to a valid logic high level.

Without the output stage, however, the level restore circuit may experience load dependent delay. To reduce this load dependent delay, the output stage can be added to the intermediate stage as show in FIG. 3. The output stage isolates transistors Q4 and Q5 from the load and makes the delay of the device less dependent on the load.

Figure 6:
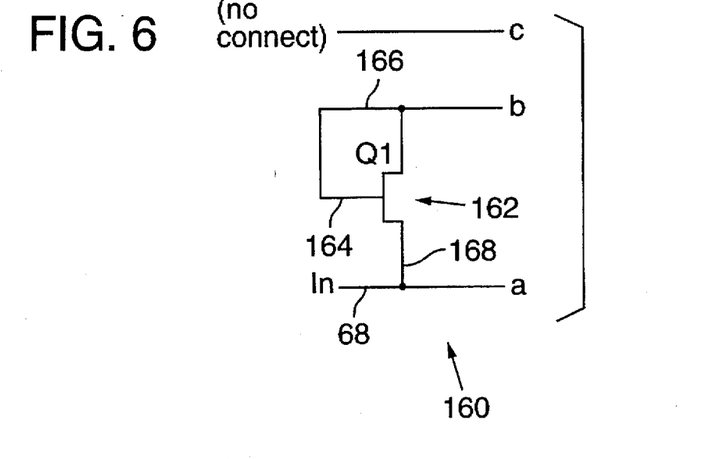
FIG. 6 is a diagram of another alternative embodiment of the input stage of the level restore circuit in FIG. 3.

FIG. 6 illustrates another alternative implementation of the input stage 160. This implementation of the input stage includes a single N-channel transistor 162 coupled between the input node and node B of the intermediate stage. The gate 164 of the N-channel transistor is coupled to its drain 166 and to node B of the intermediate stage, while the input node is coupled to the source 168 of the N-channel transistor 162 and to node A of the intermediate stage.

The transistor Q1 162 in FIG. 6 separates the gate drives of the inverter 98 of the intermediate stage 64. Specifically, transistor Q1 separates the gate drive for transistors Q4 and Q5 (FIG. 3) by about 1 threshold voltage. In this respect, it is similar to the P-channel transistor 90 in the input stage of FIG. 3. However, instead of a P-channel device 90 coupled to a ground node as in FIG. 3, the N-channel transistor Q1 162 uses the devices coupled to the input stage 160 for pull down current. For example, in the case of a pass-gate string 72 coupled to the input stage 160, transistor Q1 uses the pass-gate string to source and sink current through the pull-up transistor Q3 100 of the intermediate stage 64 (FIG. 3).

Even if the input signal to the input stage is a degraded logic high value (for example, 2 volts in a 3 volt process) the threshold voltage drop across Q1 will increase the voltage supplied to the gate 96 of Q5 to a valid logic high level and turn Q5 off. Q4 begins to turn on in response to the 2 volt signal at its gate 94 and pulls node C down to a logic low level. Q3 then turns on and pulls up node B.

When a logic low voltage is supplied to the input stage, Q5 still turns on even though the gate drive signal at node B is a threshold voltage drop above the level of the voltage at the input node. As a result, node C of the intermediate stage is pulled high and Q3 is turned off.

While the input stage in FIG. 6 does correct the gate drive problem, it is not the preferred design because it has a more limited bandwidth. For example, in the pass-gate network of FIG. 3 the size of the pull-up device 100 is limited by the ability of the network 72 to sink current.

Figure 7:
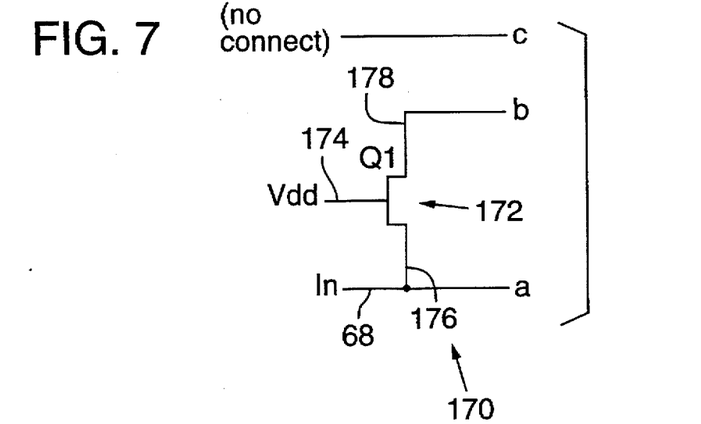
FIG. 7 is a diagram of another alternative embodiment of the input stage of the level restore circuit in FIG. 3.

FIG. 7 is a schematic diagram 170 illustrating yet another embodiment of the input stage. The input stage 170 in FIG. 7 includes a single N-channel transistor 172 coupled between the input node 68 and node B of the intermediate stage. The gate node 174 of the N-channel transistor is coupled to the supply voltage Vdd, the source node 176 is coupled to the input node of the input stage and node A of the intermediate stage, and the drain node 178 is coupled to node B of the intermediate stage.

The N-channel transistor Q1 in FIG. 7 separates the gate drive signals of Q4 and Q5 (FIG. 3) by a threshold voltage drop. When the input signal to the input stage 170 is at a logic low level, the gate drive signal to the P-channel transistor Q5 is 1 threshold voltage drop above this logical level. Transistor Q5 turns on and pulls node C of the intermediate stage up to about the supply voltage Vdd. When node C reaches a logic high level Q3 turns off.

As the input signal to the input stage 170 swings to a logic high level, transistor Q4 begins to turn on, pulling node C to a logic low level. The pull-up transistor Q3 turns on and the current through the pull-up transistor Q3 flows through the pass-gate string until the input voltage reaches the input supply voltage Vdd less the threshold voltage drop across transistor Q1. At this point, the current through the pull-up transistor Q3 is no longer sent through the pass-gate string coupled to the input stage. When this occurs, the pull-up transistor does not have to source the current to pull-up the output of the pass-gate string to a logic high level.

In FIG. 7, the voltage at the input node falls quickly until Q1 turns on. At that point, the input node has to pull transistor Q3 down to achieve a logic low level at the input node.

The input stage in FIG. 7, in conjunction with the intermediate stage of FIG. 3, operates effectively as a level restore circuit. However, the bandwidth of this particular design is not optimal.

Figure 8:
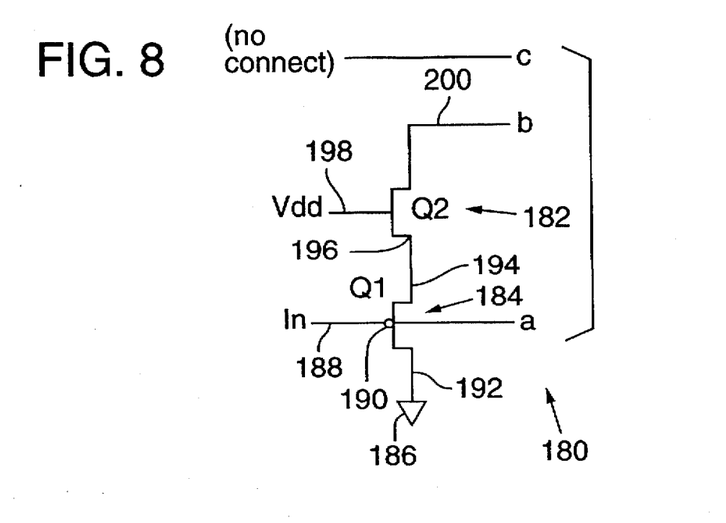
FIG. 8 is a diagram of another alternative embodiment of the input stage of the level restore circuit in FIG. 3.

FIG. 8 is a schematic diagram of yet another embodiment of the input stage 180. The input stage 180 in FIG. 8 includes an N-channel transistor 182 and a P-channel transistor 184 coupled between node B of the intermediate stage 64 and ground 186. Transistors Q1 and Q2 separate the gate nodes of transistors Q4 and Q5. In addition, the P-channel transistor 184 isolates the input node 188 from the pull-up transistor Q3 100 (FIG. 3).

The devices in the input stage 180 are connected as follows. The gate node 190 of the P-channel transistor Q1 184 is coupled to the input node 188, as well as node A of the intermediate stage. The drain node 192 is coupled to ground 186, and the source node 194 is coupled to the source node 196 of the N-channel transistor Q2. The gate node 198 of the N-channel transistor 182 is coupled to the supply voltage Vdd, while the drain node 200 is coupled to node B of the intermediate stage 64.

The input stage 180 illustrated in FIG. 8 operates as follows. When the input signal to the input stage is at logic low level, transistor Q1 turns on and transistor Q4 (FIG. 3) turns off. The voltage at node B is a P-channel and an N-channel threshold voltage drop above ground, yet is low enough to turn on transistor Q5. Node C of the intermediate stage is then pulled up to about the supply transistor Q3 which causes the pull-up transistor Q3 to turn off.

When the input signal at the input stage transitions to a degraded logic high level, transistor Q1 begins to turn off and transistor Q4 begins to turn on. In response, node C in the intermediate stage is pulled to a logic low level. As node C transitions to a logic low level, pull-up transistor Q3 turns on and pulls node B of the intermediate stage up to about the supply voltage Vdd. As node B reaches the logic high level, transistor Q5 turns off.

Transistor Q2 helps to solve the static leakage current problem through transistors Q1 and Q3 by lowering the voltage at the source node of Q1. When degraded logic high signal is supplied to the input of the input stage, the threshold drop across Q2 lowers the voltage at the supply node of Q2. Thus, Q2 serves to reduce leakage current through Q1. Transistor Q2 maintains a voltage swing at node B of about 1 volt to about 3 volts, where the supply voltage Vdd is at 3 volts. While the configuration of the input stage in FIG. 8 does address the leakage current problem, it is not optimal because it does not have a high bandwidth.

As described above, the intermediate stage illustrated in FIG. 3 can operate with any of the input stages illustrated in FIGS. 5–8 to effectively restore the voltage swing at node C from a valid logic low signal to a valid logic high signal. The output stage can be omitted and node C can be used as the output node, so long as it is driving a light load. To provide better performance for heavier loads at the output, the output stage illustrated in FIG. 3 and described above can be added as shown in FIG. 3 with any of the input stages shown in FIGS. 3 and 5 through 8. In each case, the output stage isolates the level restore circuit from the load seen at the output of the output stage.

While I have described the invention with reference to several specific embodiments, I do not intend to limit the scope of my invention to these specific embodiments.

Having described and illustrated the principles of my invention with reference to a preferred embodiment and several alternative embodiments, it should be apparent that the invention can be modified in arrangement and detail without departing from its principles. Accordingly, I claim all modifications as may come within the scope and spirit of the following claims.

I claim:

1. A level restore circuit comprising:
    an inverter having first and second gate nodes, and an output node providing an output signal;
    a pull-up device having a gate node, the pull-up device coupled to a supply voltage and the second gate node of the inverter, the gate node of the pull-up device coupled to the output of the inverter, the pull-up device operable to pull-up the second gate node of the inverter to a logic high level in response to an output signal from the output of the inverter;
    an input stage having an input node and at least one transistor, the input stage coupled to the first and second gate nodes of the inverter and coupled to the pull-up device, the input stage operable receive a logic signal at the input node that swings from a logic low level to a degraded logic high level, the input stage operable to provide separate gate drive signals to the first and second gate nodes of the inverter so that the output signal of the inverter swings from a valid logic high value to a valid logic low signal in response to the logic low and degraded logic high signals at the input node of the input stage, and the input stage being coupled between the input node and the pull-up device to isolate the pull-up device from the input node such that current through the pull-up device is not sinked through the input node.

2. A level restore circuit comprising:
    an inverter having first and second gate nodes, and an output node providing an output signal;
    a pull-up device having a gate node, the pull-up device coupled to a supply voltage and the second gate node of the inverter, the gate node of the pull-up device coupled to the output of the inverter, the pull-up device operable to pull-up the second gate node of the inverter to a logic high level in response to an output signal from the output of the inverter;
    an input stage having an input node and at least one transistor, the input stage coupled to the first and second gate nodes of the inverter and coupled to the pull-up device, the input stage operable receive a logic signal at the input node that swings from a logic low level to a degraded logic high level, the input stage operable to provide separate gate drive signals to the first and second gate nodes of the inverter so that the output signal of the inverter swings from a valid logic high signal to a valid logic low signal in response to the logic low and degraded logic high signals at the input node of the input stage;
    wherein the input stage includes a first transistor coupled between the pull-up device and ground, wherein the input node of input stage is coupled to a gate of the first transistor, and wherein the first transistor is operable to isolate the pull-up device from the input node so that current through the pull-up device is not sourced or sinked through the input node while the pull-up device is active.

3. The circuit of claim 1 wherein the inverter comprises a P-channel transistor, and an N-channel transistor coupled between the supply voltage and ground, the N-channel transistor having the first gate node, and the P-channel transistor having the second gate node.

4. A level restore circuit comprising:
    an inverter having first and second gate nodes, and an output node providing an output signal;
    a pull-up device having a gate node, the pull-up device coupled to a supply voltage and the second gate node of the inverter, the gate node of the pull-up device coupled to the output of the inverter, the pull-up device operable to pull-up the second gate node of the inverter to a logic high level in response to an output signal from the output of the inverter;

an input stage having an input node and at least one transistor, the input stage coupled to the first and second gate nodes of the inverter and coupled to the pull-up device, the input stage operable to receive a logic signal at the input node that swings from a logic low level to a degraded logic high level, the input stage operable to provide separate gate drive signals to the first and second gate nodes of the inverter so that the output signal of the inverter swings from a valid logic high value to a valid logic low signal in response to the logic low and degraded logic high signals at the input node of the input stage;

wherein the pull-up device comprises a P-channel transistor including a gate, a drain, and a source node, and wherein the gate node of the P-channel transistor is the gate of the pull-up device, wherein the drain node of the P-channel transistor is coupled to the second gate node of the inverter, and wherein the source node is coupled to the supply voltage.

5. A level restoration circuit comprising:

a first P-channel transistor having a gate, drain, and source node, the first P-channel transistor operable to receive a input logic signal with a voltage swing from a logic low level to a degraded logic high level;

an intermediate stage including;

a second P-channel transistor and an N-channel transistor coupled between a supply voltage and ground, the second P-channel transistor and the N-channel transistor each having a gate, drain and source node; the drain nodes of the second P-channel transistor and the N-channel transistor coupled together to form an output node, the gate node of the first P-channel transistor coupled to the gate node of the N-channel transistor, the gate node of the second P-channel transistor coupled to the source node of the first P-channel transistor; and a pull-up device having a gate node and being coupled between the supply voltage and the gate node of the second P-channel transistor, the gate node of the pull-up device coupled to the output node of the intermediate stage, wherein the pull-up device is operable to pull-up the gate node of the second P-channel transistor to a logic high level;

wherein the first P-channel transistor is operable to isolate the pull-up device from the input logic signal, and the output node of the intermediate stage is operable to provide a voltage swing from a valid logic high level to a valid logic low level in response to the voltage swing from a logic low level to a degraded logic high level of the input logic signal.

6. A level restoration circuit comprising:

an input stage comprising an N-channel transistor having a gate, drain and source node, the input stage operable to receive an input logic signal with a voltage swing from a logic low level to a degraded logic high level, and in response operable to supply a gate drive signal that swings up to a valid logic high level;

an intermediate stage including:

a P-channel transistor and a second N-channel transistor coupled between a supply voltage and ground, the P-channel transistor and the second N-channel transistor each having a gate, drain and source node; the drain nodes of the P-channel transistor and the second N-channel transistor coupled together to form an output node, the gate node of the P-channel transistor coupled to the N-channel transistor in the input stage to receive the gate drive signal, the gate node of the second N-channel transistor operable to receive the input logic signal; and a pull-up device having a gate node and being coupled between the supply voltage and the gate node of the P-channel transistor, the gate node of the pull-up device coupled to the output node of the intermediate stage, wherein the pull-up device is operable to pull-up the gate node of the second P-channel transistor to a logic high level;

wherein the output node of the intermediate stage is operable to provide a voltage swing from a valid logic high level to a valid logic low level in response to the voltage swing from a logic low level to a degraded logic high level of the input logic signal, respectively, and wherein the input stage is coupled between an input node for receiving the input logic signal and the pull-up device to isolate the pull-up device from the input node such that current through the pull-up device is not sinked through the input node.

7. In a level restore circuit having an inverter with first and second gate nodes and a pull-up device, an improved method for restoring a degraded logic signal to a valid logic level comprising:

receiving an input logic signal that swings from a logic low level to a degraded logic high level;

in an input stage of the level restore circuit, isolating an input node of the input stage that receives the input logic signal from the pull-up device such that current through the pull-up device is not sinked through the input node, and separating the input logic signal into first and second separate gate drive signals applied to the first and second gate nodes of the inverter, respectively, using at least a first transistor to separate the gate drive signals;

in response to a degraded logic signal applied to the level restore circuit, generating the first gate drive signal by applying the input logic signal to the first gate node of the inverter, and generating the second gate drive signal by applying an output signal from the inverter to an input of the pull up device and pulling up the second gate node of the inverter; and in response to a logic low signal applied to the level restore circuit, generating the first gate drive signal by applying the input logic signal to the first gate node of the inverter, and generating the second gate drive signal by applying a separate, logic low input signal to the second gate node of the inverter through the first transistor in the input stage.

8. A level restore circuit comprising:

an inverter having first and second gate nodes, and an output node providing an output signal;

a pull-up device having a gate node, the pull-up device coupled to a supply voltage and the second gate node of the inverter, the gate node of the pull-up device coupled to the output of the inverter, the pull-up device operable to pull-up the second gate node of the inverter to a logic high level in response to an output signal from the output of the inverter; and an input stage having an input node and at least one transistor, the input stage coupled to the first and second gate nodes of the inverter and coupled to the pull-up device, the input stage operable to receive a logic signal at the input node that swings between a logic low level and a degraded logic high level, the input stage operable to provide separate gate drive signals to the first and second gate nodes of the inverter so that the output signal of the inverter swings between a valid logic high value and a valid logic low signal in response to the logic low and degraded logic high signals at the input node of the input stage;

wherein the input node is coupled to an output node of an N pass-gate string, wherein N is an integer, wherein the pass-gate string comprises N pass-gates coupled in series, and wherein the output node of the pass-gate string provides the degraded logic high level due to the threshold voltage drop across the N pass-gate string; and wherein the input stage is coupled between the input node and the pull-up device to isolate the pull-up device from the N pass-gate string coupled to the input node such that current through the pull-up device is not sinked through the input node.

9. A level restore circuit comprising:

an inverter having first and second gate nodes, and an output node providing an output signal;

a pull-up device having a gate node, the pull-up device coupled to a supply voltage and the second gate node of the inverter, the gate node of the pull-up device coupled to the output of the inverter, the pull-up device operable to pull-up the second gate node of the inverter to a logic high level in response to an output signal from the output of the inverter; and an input stage having an input node and at least one transistor, the input stage coupled to the first and second gate nodes of the inverter and coupled to the pull-up device, the input stage operable to receive a logic signal at the input node that swings between a logic low level and a degraded logic high level, the input stage operable to provide separate gate drive signals to the first and second gate nodes of the inverter so that the output signal of the inverter swings between a valid logic high value and a valid logic low signal in response to the logic low and degraded logic high signals at the input node of the input stage;

wherein the input stage comprises a P-channel transistor having a gate, a drain and a source node, and wherein the drain node is coupled to ground, the source node is coupled to the second gate node of the inverter, and the input node is coupled to the first gate node of the inverter and to the gate node of the P-channel transistor.

10. The circuit of claim 9 wherein the input stage further comprises a pull-up device coupled between the supply voltage and the input node to pull-up the input node and reduce leakage current through the P-channel transistor in the input stage.

11. The circuit of claim 10 further including an output stage coupled to the first and second gate nodes of the inverter, and operable to isolate the inverter from a load applied at an output node of the output stage.

12. The circuit of claim 9 wherein the input stage further comprises an N-channel transistor having a gate, a drain, and a source node, wherein the gate node of the N-channel transistor is coupled to the supply voltage, the drain node of the N-channel transistor is coupled to the second gate node of the inverter, the source node of the P-channel transistor is coupled to the source node of the N-channel transistor, and the source node of the P-channel transistor is coupled to the second gate node of the inverter through the N-channel transistor.

13. The circuit of claim 12 further including an output stage coupled to the first and second gate nodes of the inverter, and operable to isolate the inverter from a load applied at an output node of the output stage.

14. The circuit of claim 9 further including an output stage coupled to the first and second gate nodes of the inverter, and operable to isolate the inverter from a load applied at an output node of the output stage.

15. A level restore circuit comprising:

an inverter having first and second gate nodes, and an output node providing an output signal;

a pull-up device having a gate node, the pull-up device coupled to a supply voltage and the second gate node of the inverter, the gate node of the pull-up device coupled to the output of the inverter, the pull-up device operable to pull-up the second gate node of the inverter to a logic high level in response to an output signal from the output of the inverter; and an input stage having an input node and at least one transistor, the input stage coupled to the first and second gate nodes of the inverter and coupled to the pull-up device, the input stage operable to receive a logic signal at the input node that swings between a logic low level and a degraded logic high level, the input stage operable to provide separate gate drive signals to the first and second gate nodes of the inverter so that the output signal of the inverter swings between a valid logic high value and a valid logic low signal in response to the logic low and degraded logic high signals at the input node of the input stage;

wherein the input stage comprises an N-channel transistor having a gate, a drain, and a source node, wherein the gate and drain of the N-channel transistor are coupled together and to the second gate node of the inverter, and wherein the source node of the N-channel transistor is coupled to the input node.

16. The circuit of claim 15 further including an output stage coupled to the first and second gate nodes of the inverter, and operable to isolate the inverter from a load applied at an output node of the output stage.

17. A level restore circuit comprising:

an inverter having first and second gate nodes, and an output node providing an output signal;

a pull-up device having a gate node, the pull-up device coupled to a supply voltage and the second gate node of the inverter, the gate node of the pull-up device coupled to the output of the inverter, the pull-up device operable to pull-up the second gate node of the inverter to a logic high level in response to an output signal from the output of the inverter;

an input stage having an input node and at least one transistor, the input stage coupled to the first and second gate nodes of the inverter and coupled to the pull-up device, the input stage operable to receive a logic signal at the input node that swings between a logic low level and a degraded logic high level, the input stage operable to provide separate gate drive signals to the first and second gate nodes of the inverter so that the output signal of the inverter swings between a valid logic high value and a valid logic low signal in response to the logic low and degraded logic high signals at the input node of the input stage; low signal in response to the logic low and degraded logic high signals at the input node of the input stage;

wherein the input stage comprises an N-channel transistor having a gate, a drain, and a source node, wherein the gate node is coupled to the supply voltage, the drain node is coupled to the second gate node of the inverter, and the source node is coupled to the input node; and an output stage coupled to the first and second gate nodes of the inverter, and operable to isolate the inverter from a load applied at an output node of the output stage.

18. A level restore circuit comprising:

an inverter having first and second gate nodes, and an output node providing an output signal;

a pull-up device having a gate node, the pull-up device coupled to a supply voltage and the second gate node of the inverter, the gate node of the pull-up device coupled to the output of the inverter, the pull-up device operable to pull-up the second gate node of the inverter to a logic high level in response to an output signal from the output of the inverter; and an input stage having an input node and at least one transistor, the input stage coupled to the first and second gate nodes of the inverter and coupled to the pull-up device, the input stage operable to receive a logic signal at the input node that swings between a logic low level to a degraded logic high level, the input stage operable to provide separate gate drive signals to the first and second gate nodes of the inverter so that the output signal of the inverter swings between a valid logic high value and a valid logic low signal in response to the logic low and degraded logic high signals at the input node of the input stage;

wherein the input stage comprises a P-channel and an N-channel transistor, each having a gate, a drain and a source node, wherein the gate node of the N-channel transistor is coupled to the supply voltage, the drain node of the N-channel transistor is coupled to the second gate node of the inverter, the source nodes of the P-channel and the N-channel transistors are coupled together, the gate node of the P-channel transistor is coupled to the input node and to the first gate node of the inverter, and the drain node of the P-channel transistor is coupled to ground.

19. The circuit of claim 18 further including an output stage coupled to the first and second gate nodes of the inverter, and operable to isolate the inverter from a load applied at an output node of the output stage.

20. A level restore circuit comprising:

an inverter having first and second gate nodes, and an output node providing an output signal;

a pull-up device having a gate node, the pull-up device coupled to a supply voltage and the second gate node of the inverter, the gate node of the pull-up device coupled to the output of the inverter, the pull-up device operable to pull-up the second gate node of the inverter to a logic high level in response to an output signal from the output of the inverter;

an input stage having an input node and at least one transistor, the input stage coupled to the first and second gate nodes of the inverter and coupled to the pull-up device, the input stage operable to receive a logic signal at the input node that swings between a logic low level and a degraded logic high level, the input stage operable to provide separate gate drive signals to the first and second gate nodes of the inverter so that the output signal of the inverter swings between a valid logic high value and a valid logic low signal in response to the logic low and degraded logic high signals at the input node of the input stage; and an output stage coupled to the first and second gate nodes of the inverter, and operable to isolate the inverter from a load applied at an output node of the output stage.

21. The circuit of claim 20 wherein the output stage includes a P-channel and an N-channel transistor coupled between the supply voltage and ground, wherein both the P-channel and the N-channel transistor have gate nodes, the gate node of the N-channel transistor coupled to the first gate node of the inverter and the gate node of the P-channel transistor coupled to the second gate node of the inverter, and wherein the output node of the output stage is located at a node between the P-channel and the N-channel transistor in the output stage.

22. A level restore circuit comprising:

an inverter having first and second gate nodes, and an output node providing an output signal;

a pull-up device having a gate node, the pull-up device coupled to a supply voltage and the second gate node of the inverter, the gate node of the pull-up device coupled to the output of the inverter, the pull-up device operable to pull-up the second gate node of the inverter to a logic high level in response to an output signal from the output of the inverter, wherein the pull-up device comprises a P-channel transistor including a gate, a drain, and a source node, and wherein the gate node of the P-channel transistor is the gate of the pull-up device, wherein the drain node of the P-channel transistor is coupled to the second gate node of the inverter, and wherein the source node is coupled to the supply voltage;

an input stage having an input node and at least one transistor, the input stage coupled to the first and second gate nodes of the inverter and coupled to the pull-up device, the input stage operable to receive a logic signal at the input node that swings between a logic low level and a degraded logic high level, the input stage operable to provide separate gate drive signals to the first and second gate nodes of the inverter so that the output signal of the inverter swings between a valid logic high value and a valid logic low signal in response to the logic low and degraded logic high signals at the input node of the input stage; and an output stage coupled to the first and second gate nodes of the inverter, and operable to isolate the inverter from a load applied at an output node of the output stage.

* * * * *